United States Patent
Leeser et al.

(10) Patent No.: US 8,343,318 B2
(45) Date of Patent: Jan. 1, 2013

(54) MAGNETIC LENSING TO IMPROVE DEPOSITION UNIFORMITY IN A PHYSICAL VAPOR DEPOSITION (PVD) PROCESS

(75) Inventors: Karl Leeser, San Jose, CA (US); Ishtak Karim, San Jose, CA (US); Alexander Dulkin, Sunnyvale, CA (US)

(73) Assignee: Novellus Systems Inc., San Jose, CA (US)

( * ) Notice: Subject to any disclaimer, the term of this patent is extended or adjusted under 35 U.S.C. 154(b) by 385 days.

(21) Appl. No.: 12/731,713

(22) Filed: Mar. 25, 2010

(65) Prior Publication Data

US 2011/0233050 A1     Sep. 29, 2011

(51) Int. Cl.
*C23C 14/35* (2006.01)
(52) U.S. Cl. .......... 204/192.12; 204/298.16; 204/298.19
(58) Field of Classification Search ............. 204/192.12, 204/298.16, 298.19, 298.2; 118/723 MR, 118/723 MA; 156/345.42
See application file for complete search history.

(56) References Cited

U.S. PATENT DOCUMENTS

| | | | | |
|---|---|---|---|---|
| 5,085,755 A | * | 2/1992 | Setoyama et al. | 204/298.16 |
| 5,346,579 A | * | 9/1994 | Cook et al. | 156/345.42 |
| 6,197,167 B1 | * | 3/2001 | Tanaka | 204/192.15 |
| 6,613,199 B1 | * | 9/2003 | Tobin et al. | 204/192.12 |

OTHER PUBLICATIONS

Plasma Processing: Reactive Ion Etching, PECVD, Ashing, Sputtering, Plasma Chemistry, Discharge Physics, and Surface Interactions; Herb Sawin, Professor of Chemical Engineering and Electrical Engineering and Computer Science at the Massachusetts Institute of Technology; Jun. 26-30, 2000; p. 168.
Industrial Plasma Engineering, vol. 1: Principles; J. Reece Roth; Department of Electrical and Computer Engineering University of Tennessee, Knoxville; Institute of Physics Publishing Bristol and Philadelphia; 1995; pp. 78-91.

* cited by examiner

*Primary Examiner* — Rodney McDonald

(57) ABSTRACT

A physical vapor deposition (PVD) system includes a chamber and a plurality of electromagnetic coils arranged around the chamber. First and second annular bands of permanent magnets are arranged around the chamber with poles oriented perpendicular to a magnetic field imposed by the electromagnetic coils. Each of the permanent magnets in the first annular band is arranged with poles having a first polarity closest to a central axis of the chamber. Each of the permanent magnets in the second annular band is arranged anti-parallel with respect to the permanent magnets in the first annular band.

32 Claims, 6 Drawing Sheets

MAGNETIC LENSING TO IMPROVE DEPOSITION UNIFORMITY IN A PHYSICAL VAPOR DEPOSITION (PVD) PROCESS

FIELD

The present disclosure relates to physical vapor deposition (PVD) systems and more particularly to generation of magnetic fields in PVD systems.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Physical vapor deposition ("PVD") systems deposit metal layers onto substrates such as semiconductor wafers. The metal layers can be used as diffusion barriers, adhesion or seed layers, primary conductors, antireflection coatings, etch stops, etc.

In PVD systems, plasma feed gas such as Argon is introduced into a chamber. Electrons collide with atoms of the plasma feed gas to create ions. Magnetic fields are used to increase a residence time of the electrons by causing the electrons to spiral through the plasma. As a result, ionization levels of the plasma feed gas also increase. As the number of ions increase, the deposition rate also tends to increase.

A negative potential applied to a cathode attracts the ions towards a target. The ions collide with the target with high energy. Target atoms are dislodged from the surface of the target by direct momentum transfer. The impact of the ions on the target also releases secondary electrons. The dislodged atoms and ions (electrostatically attracted by the secondary electrons) are then deposited on a substrate such as a semiconductor wafer.

Some applications require the deposition of a thin layer of barrier or liner metal in a trench or via. Deposition of sufficient material onto a bottom or sidewall depends on the capability of the PVD process to direct the flow of sputtered atoms onto the substrate. In gap-fill applications, or filling of vias and trenches with primary metals, obtaining acceptable step coverage similarly requires directionality of sputtered atoms.

Some PVD systems use additional electromagnetic coils in the transfer region to adjust and shape the magnetic fields. The PVD systems may create one or more magnetic null points to provide a directed beam of ions emanating from the target region. The target region and the transfer region are magnetically separated by a separatrix, a surface upon which magnetic field lines converge and on which the null point(s) reside. Since the PVD systems generally use concentric electromagnetic coils to generate the magnetic field, the null point is usually situated on the central axis of the PVD system. As a result, a deposition profile of these PVD systems usually has a large radial gradient.

Maximizing ion collection below the separatrix and spreading the ions uniformly across the substrate are typically opposing goals. In a PVD system with concentric electromagnetic coils and a single null point, maximizing ion collection usually involves maximizing the coil currents to maximize ion confinement. This usually leads to a very narrow beam of ions and relatively poor center to edge uniformity at the substrate.

Attempting to spread the ion beam while maintaining high ion density by lowering the confinement field and/or imposing a counter field near the wafer level to diverge the field lines just above the wafer has proven to be difficult.

SUMMARY

A physical vapor deposition (PVD) system includes a chamber and a plurality of electromagnetic coils arranged around the chamber. First and second annular bands of permanent magnets are arranged around the chamber with poles oriented perpendicular to a magnetic field imposed by the electromagnetic coils. Each of the permanent magnets in the first annular band is arranged with poles having a first polarity closest to a central axis of the chamber. Each of the permanent magnets in the second annular band is arranged anti-parallel with respect to the permanent magnets in the first annular band.

In other features, the first polarity is South. The chamber includes a target region, a transfer region and a substrate region. The first and second annular bands are arranged in the transfer region. The first annular band comprises N annular rings of permanent magnets arranged around the central axis in the transfer region between the target region and the second annular band, where N is an integer greater than zero. A first fill rate of the N annular rings is approximately one-half.

In other features, the permanent magnets in at least one of the N annular rings are rotationally offset relative to the permanent magnets in at least another one of the N annular rings, where N is an integer greater than one. A gap that is greater than a width of the permanent magnets is provided between at least two of the N annular rings, where N is an integer greater than one. The second annular band comprises M annular rings of permanent magnets arranged around the central axis in the transfer region between the substrate region and the first annular band, where M is an integer greater than zero.

In other features, the magnetic fields generated in the chamber produce a first separatrix adjacent to the target region and a second separatrix adjacent to a substrate region. The first separatrix is convex and the second separatrix is concave relative to a direction of ion and electron motion while traveling from a target to the substrate.

In other features, a minimum strength of the magnetic fields adjacent to walls of the chamber in the transfer region ranges from 38 to 200 Gauss. The PVD system is a hollow cathode magnetron system and the target is non-planar.

In other features, a pedestal is arranged in the substrate region that supports a substrate. An RF bias generator biases the pedestal with an RF bias at a frequency greater than or equal to 400 kHz and a power level greater than or equal to 100 Watts. Plasma is ionized in the substrate region above the substrate.

A method for at least one of etching a substrate and depositing a target material on a substrate includes generating magnetic fields in a chamber using a plurality of electromagnetic coils. The method further includes controlling confinement and beam spreading of target atoms sputtered from a target material using first and second annular bands of permanent magnets. The first and second annular bands of permanent magnets are arranged around the chamber with poles oriented perpendicular to a magnetic field imposed by the electromagnetic coils. Each of the permanent magnets in the first annular band is arranged with poles having a first polarity closest to a central axis of the chamber. Each of the permanent magnets in the second annular band is arranged anti-parallel with respect to the permanent magnets in the first annular band.

In other features, the first polarity is South. The first annular band comprises N annular rings of permanent magnets arranged around the central axis in a transfer region between a target region and the second annular band, where N is an integer greater than zero. A first fill rate of the N annular rings is approximately one-half. The permanent magnets in at least one of the N annular rings are rotationally offset relative to the permanent magnets in at least another one of the N annular rings, where N is an integer greater than one.

In other features, the method includes arranging a gap that is greater than a width of the permanent magnets between at least two of the N annular rings, where N is an integer greater than one. The second annular band comprises M annular rings of permanent magnets arranged around the central axis in the transfer region between a substrate region and the first annular band, where M is an integer greater than zero. The magnetic fields generated in the chamber produce a first separatrix adjacent to the target region and a second separatrix adjacent to a substrate region. The first separatrix is convex and the second separatrix is concave relative to a direction of ion and electron motion while traveling from a target to the substrate.

In other features, a minimum strength of the magnetic fields adjacent to walls of the chamber in the transfer region ranges from 38 to 200 Gauss. The PVD system is a hollow cathode magnetron system and the target is non-planar. The method further includes supporting a substrate on a pedestal in a substrate region and biasing the pedestal with an RF bias at a frequency greater than or equal to 400 kHz and a power level greater than or equal to 100 Watts. Plasma is ionized in the substrate region above the substrate.

A method for at least one of etching a substrate and depositing a target material on a substrate includes generating magnetic fields in a chamber using a plurality of electromagnetic coils. The method further includes adjusting magnetic fields in a transfer region of the chamber to control confinement and beam spreading of target atoms sputtered from the target material using first and second annular bands of permanent magnets arranged around the transfer region. Each of the permanent magnets in the first annular band is arranged between the target region and the second annular band and with South poles closest to a central axis of the chamber. Each of the permanent magnets in the second annular band is arranged between the first annular band and a substrate region and with North poles closest to the central axis of the chamber.

In other features, the method further includes generating a first separatrix adjacent to the target region and a second separatrix adjacent to a substrate region. The first separatrix is convex and the second separatrix is concave relative to a direction of ion and electron motion while traveling from a target to the substrate. The poles of the permanent magnets in the first and second annular bands are oriented perpendicular to a magnetic field imposed by the electromagnetic coils. The first annular band comprises N annular rings of permanent magnets arranged around the central axis in the transfer region, where N is an integer greater than zero. A first fill rate of the first annular band is approximately one-half.

In other features, the permanent magnets in at least one of the N annular rings are rotationally offset relative to the permanent magnets in at least another one of the N annular rings, where N is an integer greater than one. The method further includes providing a gap that is greater than a width of the permanent magnets between at least two of the N annular rings, where N is an integer greater than one. The second annular band comprises M annular rings of permanent magnets arranged around the central axis in the transfer region, where M is an integer greater than zero.

In other features, a minimum strength of the magnetic fields adjacent to walls of the chamber in the transfer region ranges from 38 to 200 Gauss. The PVD system is a hollow cathode magnetron system and the target is non-planar.

In other features, the method includes supporting a substrate on a pedestal in a substrate region and biasing the pedestal with an RF bias at a frequency greater than or equal to 400 kHz and a power level greater than or equal to 100 Watts. Plasma is ionized in the substrate region above the substrate.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

Figure 1:
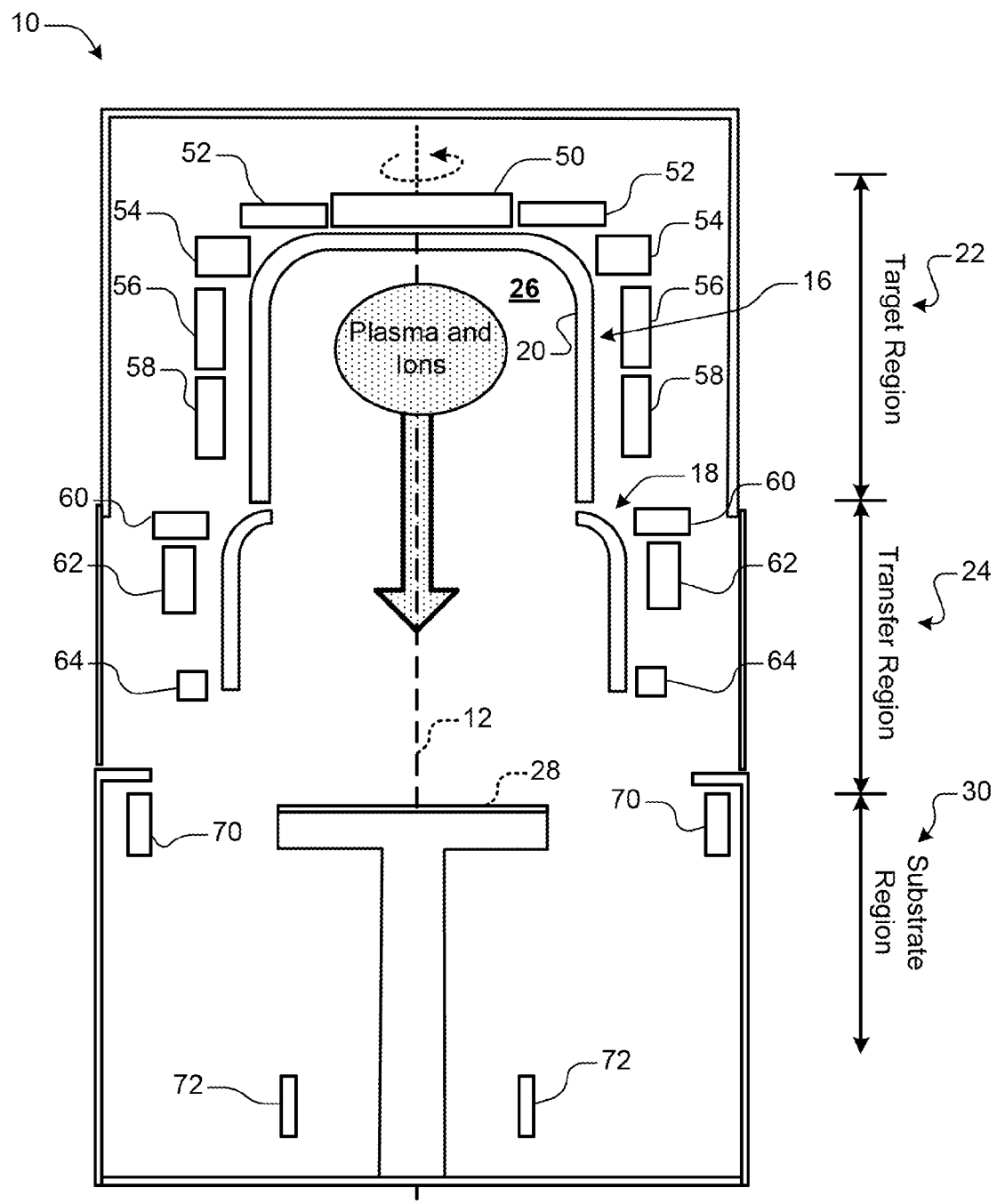
FIG. 1 is a cross-sectional view of a physical vapor deposition (PVD) system.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

PVD systems and methods according to the present disclosure employ first and second annular bands of permanent magnets that are arranged around the chamber to supplement and alter magnetic fields produced by electromagnetic coils. Using this approach to control the magnetic topology tends to substantially increase ion collection and subsequent transfer to the substrate without compromising uniformity at the substrate.

Referring now to FIG. 1, an exemplary PVD system is shown. As can be appreciated, while a Hollow Cathode Magnetron (HCM) PVD system 10 is shown, the present disclosure applies to other PVD systems. The HCM PVD system 10 is generally symmetric about a central axis 12 and typically includes a cathode 16 and an anode 18.

The cathode 16 also includes a target 20, which provides material to be deposited onto a substrate 28. For example only, the target 20 can be made of aluminum, tantalum, titanium, copper or other suitable target material. For HCM applications, the cathode 16 and target may have a hollow non-planar shape as shown, although other arrangements are contemplated.

Plasma is generated in the HCM PVD system 10 by introducing a plasma feed gas, such as Argon, into a container portion 26 of the cathode 16. For example only, a negative bias is applied to the cathode 16 while holding the chamber at ground potential. For example only, a voltage supply (not shown) may supply a negative DC voltage across the cathode target 20 and an adapter ring (not shown). The adapter ring and the chamber may be connected to chassis ground or another reference potential. The anode 18 is typically allowed to float. In other words, the anode 18 is neither grounded nor biased. As a result, an electric field is generated across the plasma feed gas. For example only, the negative bias may be on the order of −200 VDC to −600 VDC, although other bias voltages may be used.

The negative bias on the cathode 16 accelerates positive ions of the formed plasma towards the target 20 to sputter atoms from the target 20 in a target region 22. The sputtered atoms may or may not become ionized, and a subset of them subsequently travels through a transfer region 24 and onto substrate 28 arranged in a substrate region 30.

One or more permanent magnets 50 may be rotated relative to the central axis 12 to provide a rotating magnetic field in the target region of the chamber. Electromagnetic coils may also be used to control the magnetic field at various points of the chamber. Since the substrate 28 is usually a circular wafer, concentric electromagnetic coils may be used.

In FIG. 1, one or more electromagnetic coils 52, 54, 56 and 58 are arranged in the target region 22 to control the magnetic field in the target region 22. Similarly, one or more electromagnetic coils 60, 62 and 64 are arranged in the transfer region 24 to control the magnetic field in the transfer region 24. Likewise, one or more electromagnetic coils 70 and 72 are arranged in the substrate region 30 to control the magnetic field in the substrate region 30.

The magnetic topology in the target region 22 is different from that in the transfer region 24. The target region 22 and the transfer region 24 are separated by an abstract magnetic surface called a separatrix. The separatrix serves as the boundary between plasma confined within the container 26 and plasma that has escaped. The separatrix may have one or more points where the magnetic field vanishes or is at a relatively low level. By varying the shape of the magnetic fields of the electromagnetic coils, the plasma escaping from the target region 22 can be directionally controlled.

Figure 2:
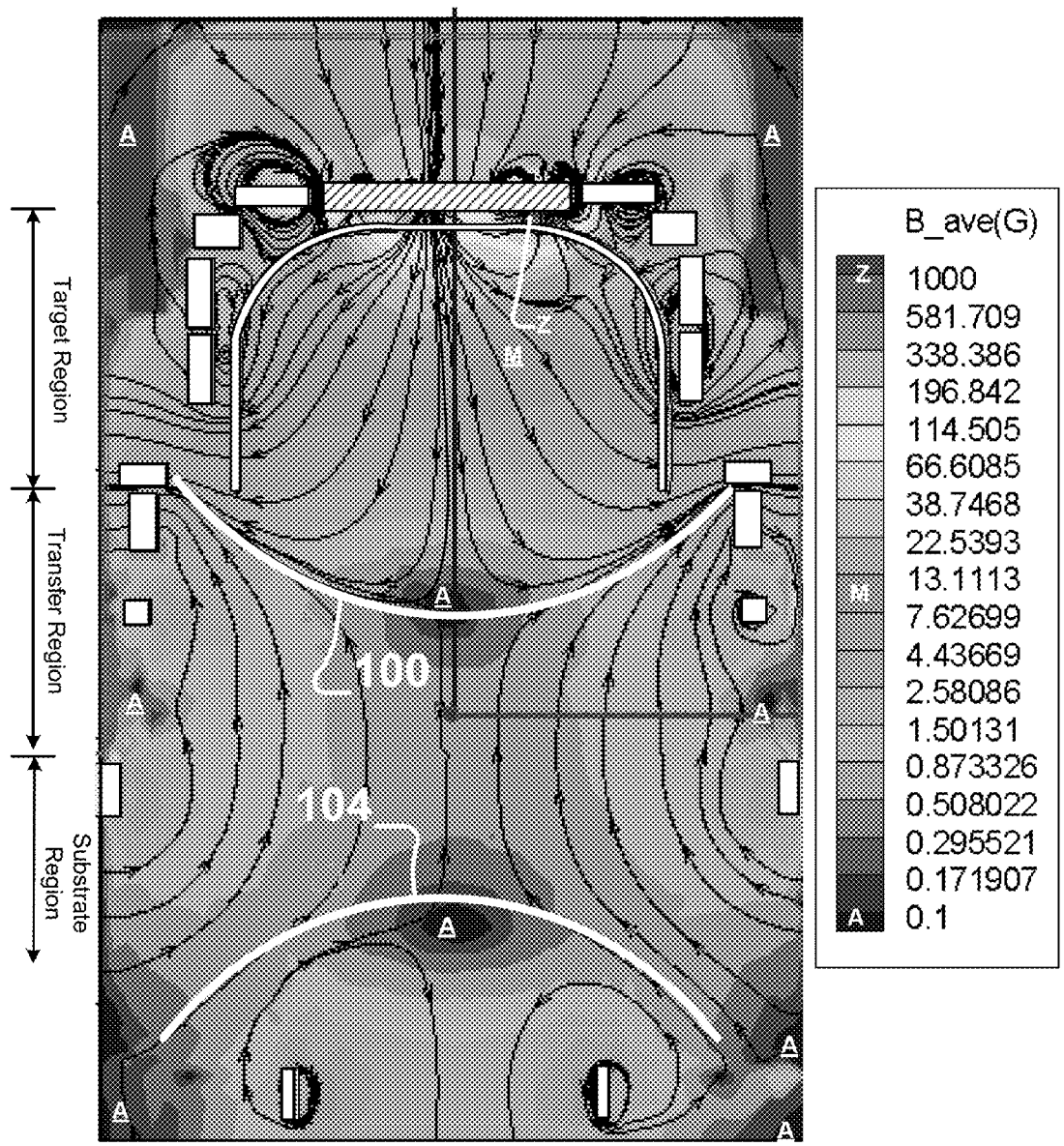
FIG. 2 is a cross-sectional view of estimated magnetic field of a PVD system similar to FIG. 1.

Referring now to FIG. 2, the electromagnetic coils from FIG. 1 can be used to create a magnetic topology with an upper separatrix 100 and a lower separatrix 104. The lower separatrix 104 is considered a non-confining separatrix since it has a shape that arches upwards against (or convex relative to) a direction of ion and electron motion while traveling from a target to the substrate.

The magnetic field strength shown in FIG. 2 varies from the null level identified at A to intermediate levels identified at M to maximum levels identified at Z. The maximum levels Z are typically found near the permanent magnets. For example only, A regions may be less than 1 Gauss, M regions may be around 10 Gauss and Z regions may be around 1000 Gauss. The direction of the two dimensional projection of the magnetic field lines is indicated by the arrows.

The lower separatrix 104 can be created using the electromagnetic coil 72. The electromagnetic coil 72 is typically smaller than the other electromagnetic coils and is arranged below the substrate 28. The lower separatrix 104 can also be created by using a combination of the electromagnetic coil 72 and the electromagnetic coil 70. The electromagnetic coil 70 may be a relatively large electromagnetic coil.

Electrons escape from a null point in the upper separatrix 100 to the lower separatrix 104 and follow the lower separatrix 104 outwards. Ions electrostatically follow the electrons and effectively spread near substrate level. The ions have a high, outwardly-pointing angular incidence, which causes high in-feature asymmetry. Directionality can be improved with the addition of an RF bias, but this approach may tend to increase ion energy to an undesirable level.

Figure 3:
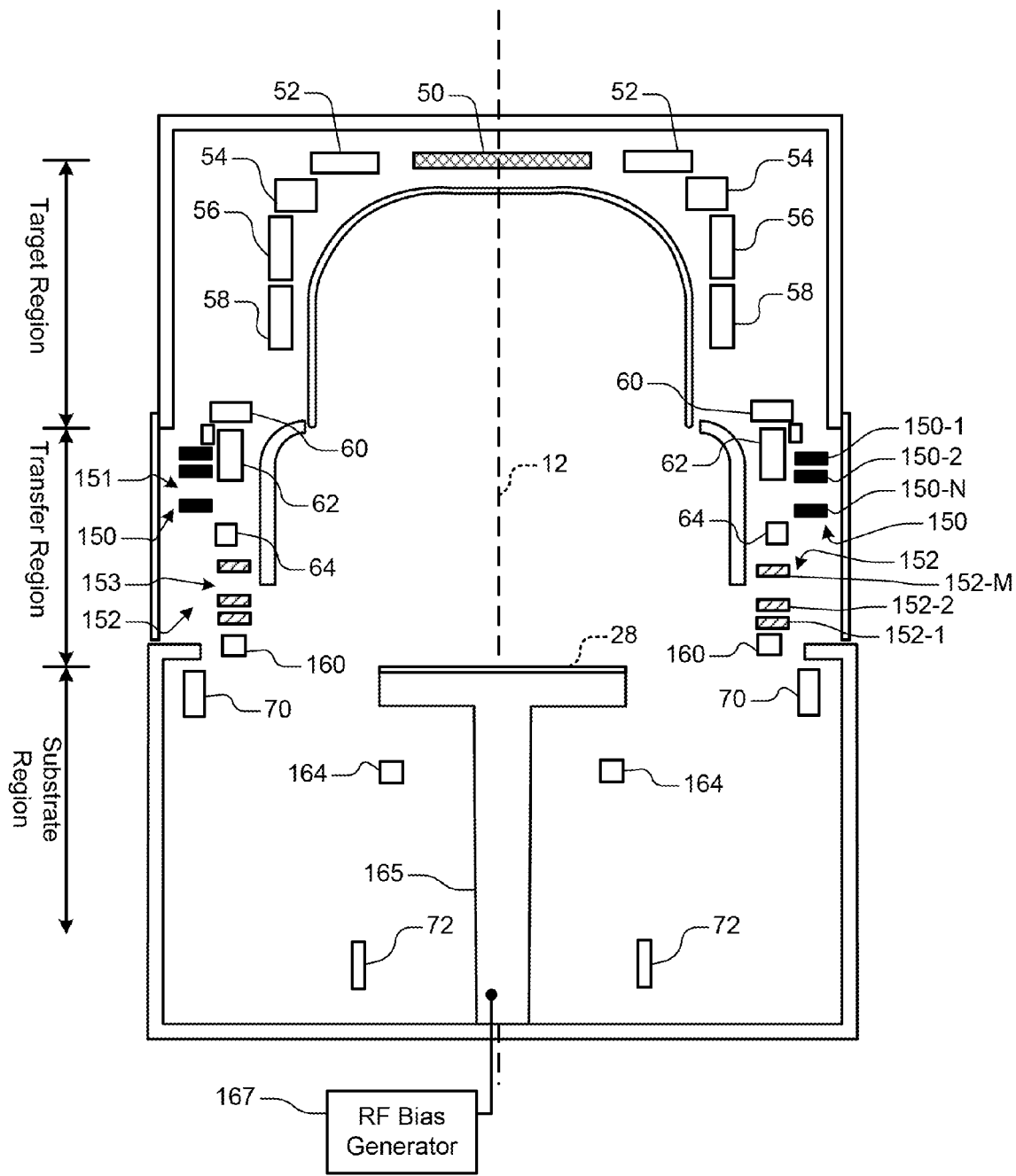
FIG. 3 is a cross-sectional view of a PVD system according to the present disclosure.

Referring now to FIG. 3, the PVD system according to the present disclosure achieves improved ion confinement and deposition uniformity using first and second annular bands 150 and 152 of permanent magnets with appropriate strengths and orientation in the transfer region 24. The first and second annular bands 150 and 152 have poles that are oriented perpendicular relative to a magnetic field imposed by the electromagnetic coils. The first and second annular bands 150 and 152 are separated vertically and magnetically oriented anti-parallel to each other. In some implementations, the permanent magnets have a strength that is greater than or equal to 25 mega-gauss-oersted (MGO).

One or more additional sets of electromagnetic coils may be provided. For example only, electromagnetic coils 160 and 164 may be provided to further shape the magnetic field in the transfer region.

The substrate 28 is arranged on and supported by a pedestal 165 that is located in the substrate region. An RF bias generator 167 selectively biases the pedestal 165 with an RF bias. Plasma is ionized in the substrate region above the substrate 28 when the RF bias is applied. The RF bias may have a power level of 1200 Watts (W) and a frequency of 13.56 MHz for Argon plasma feed gas, however other plasma feed gas, frequencies and power levels may be used. In other implementations, RF bias power levels greater than or equal to 100 Watts (W) and/or frequencies greater than or equal to 400 kHz can be used. Depending upon the DC power level, the RF power level and RF frequency, various etch/deposition ratios may be achieved. In some implementations, a very high or infinite etch/deposition ratio may be achieved.

Depending upon the strength of the permanent magnets that are used, the first annular band 150 of permanent magnets may comprise one or more annular rings 150-1, 150-2, . . . and 150-N, where N is an integer greater than zero. The second annular band 152 of permanent magnets may comprise one or more annular rings 152-1, 152-2, . . . and 152-M, where M is an integer greater than zero.

In the example in FIG. 3, the first annular band 150 of permanent magnets may comprise N=3 annular rings of permanent magnets, although a different number may be used. The permanent magnets in each of the annular rings 150-1, 150-2 and 150-3 are arranged with the North pole pointing out. The poles are oriented perpendicular to the magnetic field imposed by the electromagnetic coils. Each of the annular rings is approximately one-half filled. As used herein, approximately one-half filled refers to a fill rate from 40-60%.

The first annular ring 150-1 is closest to the target region. The first and second annular rings 150-1 and 150-2 are arranged adjacent to each other. The third annular ring 150-3 is spaced from the second annular ring 150-2. For example only, the third annular ring 150-3 may be spaced from the second annular ring 150-2 by an intervening gap 151. The gap 151 may be similar in dimension to the other annular rings or have a different dimension. The gap 151 may be greater than a diameter or width of the permanent magnets.

The second annular band 152 of permanent magnets may comprise M=3 annular rings of permanent magnets, although a different number may be used. The permanent magnets in each of the annular rings 152-1, 152-2 and 152-3 are arranged with South pole pointing out. The poles are oriented perpendicular to the magnetic field imposed by the electromagnetic coils. Each of the annular rings is half filled. The first annular ring 152-1 of the second annular band 152 is closest to the substrate region. The first and second annular rings 152-1 and 152-2 are arranged adjacent to each other. The third annular ring 152-3 is spaced from the second annular ring 152-2. For example only, the third annular ring 152-3 may be spaced from the second annular ring 152-2 by an intervening gap 153.

As can be appreciated, the particular arrangement and number of permanent magnets in the first and second annular bands may be adjusted to suit a particular application. The arrangements may be related to the size, shape and strength of the permanent magnets that are used, the size of the chamber, the size of the substrate and other factors.

Figure 4:
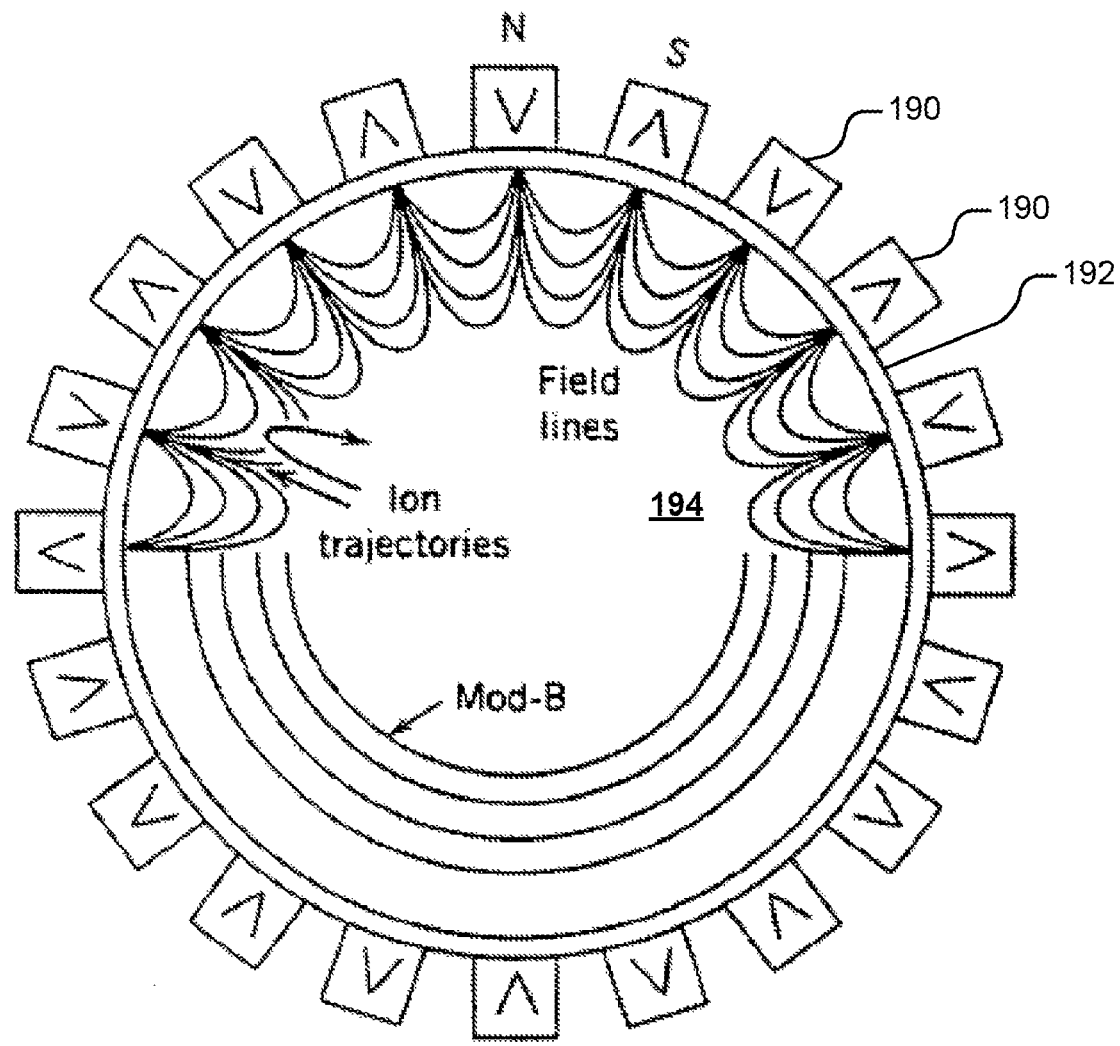
FIG. 4 is a cross-sectional view of a multi-cusp or multi-pole magnetic arrangement according to the prior art.

Referring now to FIG. 4, some plasma reactors use multi-cusp or multi-pole magnetic arrangements in the transfer region to increase confinement and create a magnetic mirror where the flux lines intersect. For example, see Herb Sawin, "Plasma Processing: Reactive Ion Etching, PECVD, Ashing, Sputtering, Plasma Chemistry, Discharge Physics, and Surface Interactions", (Jun. 26-30, 2000), p. 168, which is incorporated herein by reference in its entirety. In these devices, stacks of magnets 190 having alternating polarity are arranged around a perimeter 192 of a chamber 194. In other words, the permanent magnets alternate in an axial plane perpendicular to the central axis of the chamber in contrast to the arrangement disclosed herein.

In this arrangement, the loss of plasma to the walls is reduced. High energy electrons that would typically be transported to a chamber wall and penetrate a sheath are repelled by the strong radial magnetic fields. In this arrangement, the penetration of the magnetic field into the plasma is limited to a few times the spacing between the magnets. Therefore, the bulk of the plasma volume is relatively magnetic field free unlike the magnetic fields produced by PVD systems according to the present disclosure.

Figure 5:
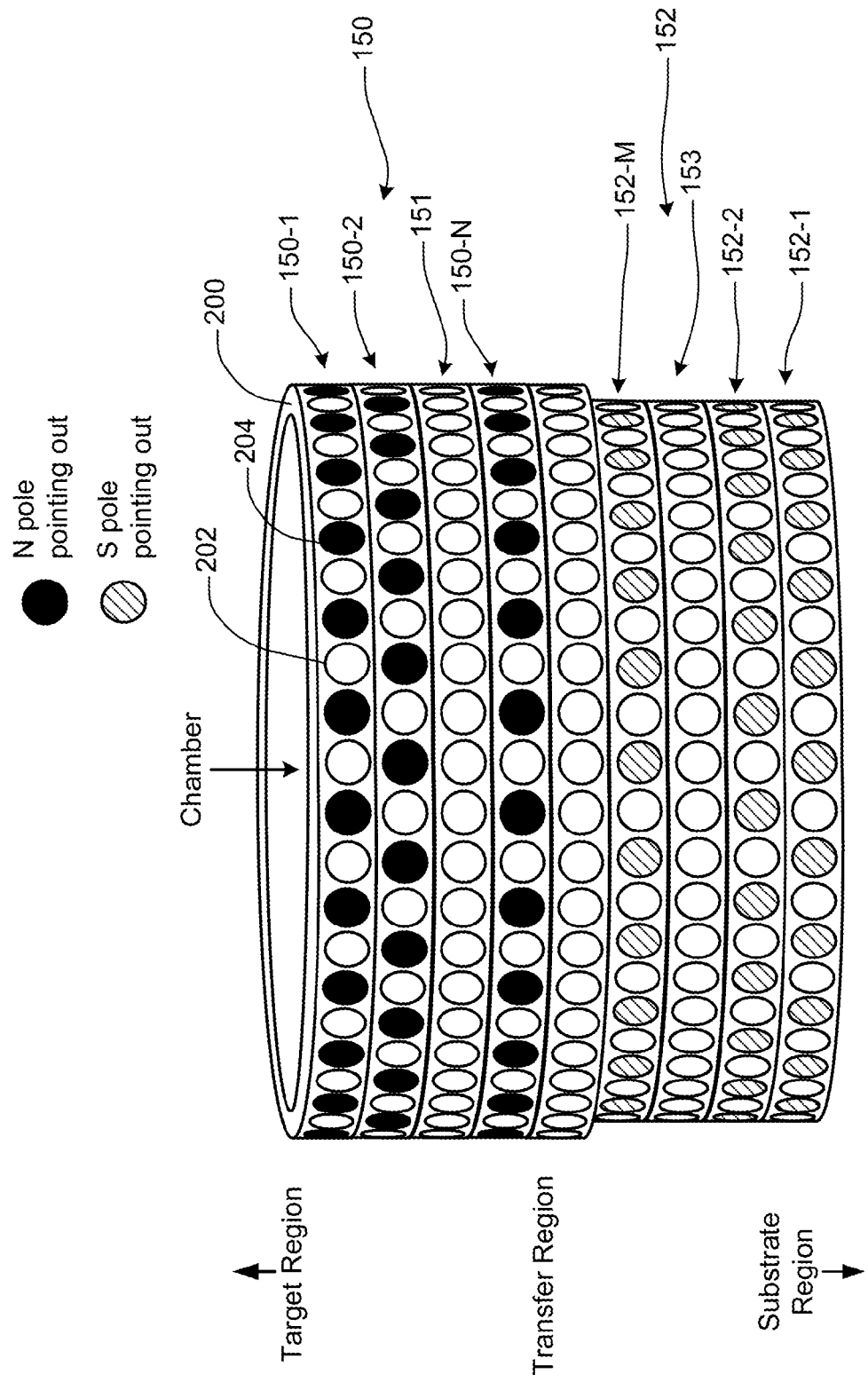
FIG. 5 illustrates one exemplary implementation of first and second annular bands of permanent magnets arranged in the transfer region of the PVD system of FIG. 4.

Referring now to FIG. 5, an exemplary implementation of the first and second annular bands 150 and 152 of permanent magnets is shown in further detail. Annular portions 200 define slots 202 that receive permanent magnets 204. For example, the first annular ring 150-1 of the first annular band 150 includes slots 202 that are half filled by the permanent magnets 204. The annular portions 200 may have varying radial dimensions. For example in FIG. 5, the annular portions 200 associated with the second annular band 152 have a radial dimension that is smaller than the radial dimension of the first annular band 150. As can be appreciated, variations in the radial dimensions may also occur within the annular rings of the first or second annular bands 150 and 152.

As can be seen in FIG. 5, each of the annular rings of the first annular band 150 may have the same permanent magnet fill pattern except that the fill patterns of the annular rings may be rotated by one slot relative to adjacent annular rings. Likewise, the annular rings of the second annular band 152 may have a similar pattern. The first and second annular bands 150 and 152 may also be offset in a similar manner as shown in FIG. 5. This arrangement of the permanent magnets in the first and second annular bands 150 and 152 imparts a curved trajectory to the ions traversing the transfer region.

Figure 6:
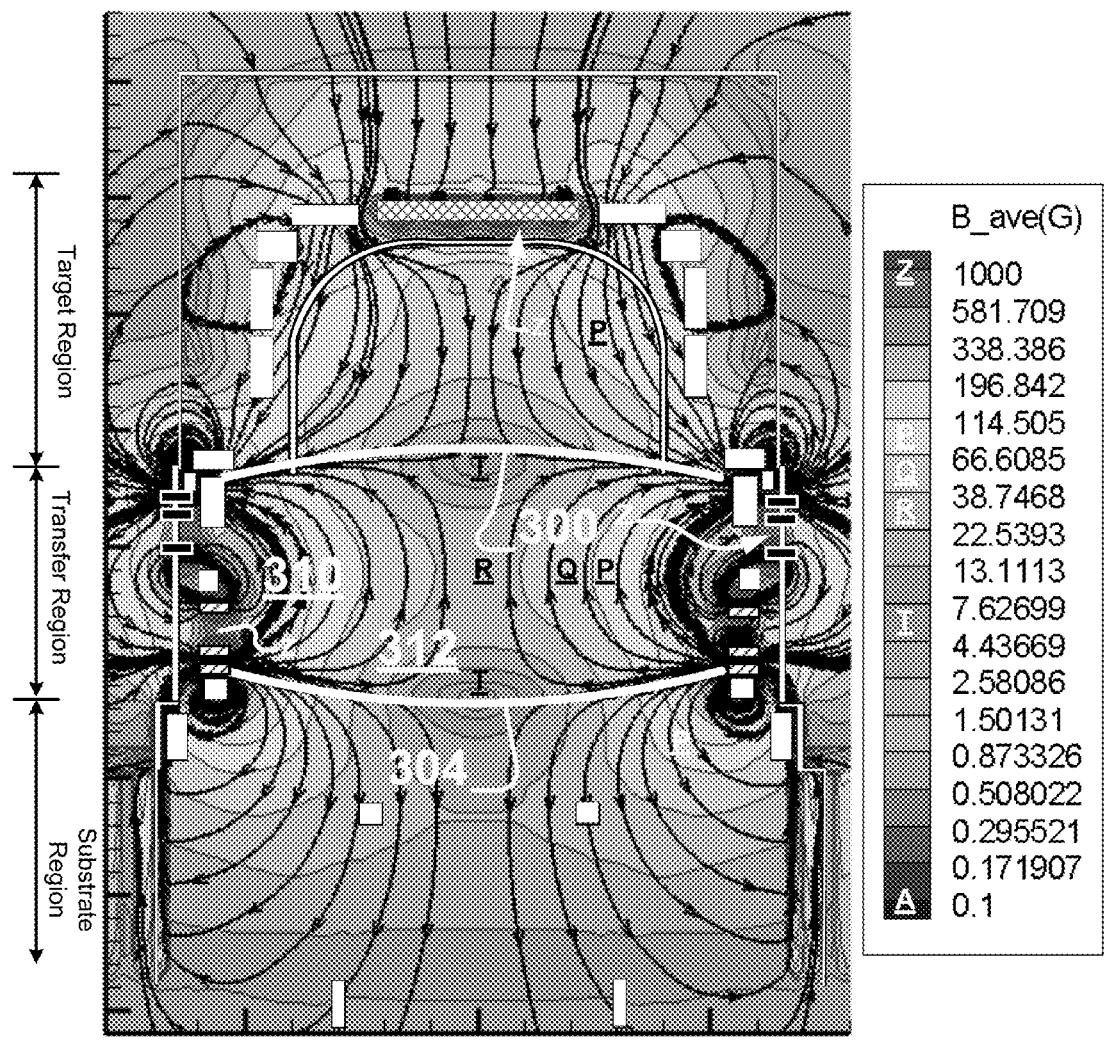
FIG. 6 is a cross-sectional view of estimated magnetic field of a PVD system similar to FIG. 3 with the annular bands of permanent magnets.

Referring now to FIG. 6, the PVD system according to the present disclosure generates an upper separatrix 300 and a lower separatrix 304. Using the first and second annular bands 150 and 152 of permanent magnets in addition to the electromagnetic coils as described above allows the lower separatrix 304 to have positive concavity. As previously discussed above, producing a counter field using one or more of the lower electromagnetic coils to spread the ions is ineffective since the lower separatrix 104 in FIG. 2 will usually have negative concavity. The latter magnetic topology has proven to be insufficient in spreading a high density ion beam.

Furthermore, using the permanent magnets as described herein may result in a significantly higher magnetic field strength in the transfer region. In particular, the magnetic field strength of the PVD system of FIGS. 1 and 2 is typically less than 10 Gauss everywhere in the transfer region and falls to almost zero near the upper and lower separatrices 100 and 104. In contrast, a minimum strength of the magnetic fields in the transfer region in FIG. 6 is in the range of 38 to 200 Gauss adjacent to the chamber walls.

In FIG. 6, the first and second annular bands 150 and 152 of permanent magnets in the transfer region provide the lower separatrix 304 that arches downwards with positive concavity. The first and second annular bands 150 and 152 of permanent magnets are selected to have sufficient strength to dominate the magnetic field in the chamber. This setting enables generation of a strong confining field in the transfer region and high curvature spreading of the field near the second annular band of magnets, which is located near the substrate.

Very strong magnetic fields near the chamber walls in the transfer region 24 effectively keep high density plasma away from the chamber walls for maximum confinement and transfer as can be seen at 310 in FIG. 6. High field curvature at the wafer level allows the beam to spread as can be seen at 312 in FIG. 6.

As can be seen in FIG. 6, the magnetic field strength ranges from a maximum value (around 1000 Gauss at Z) near the permanent magnets in the first and second annular bands, to a value of around 22.5 to 38.7 Gauss at R, to a local minimum at T (around 4.4 to 7.6 Gauss) (near the upper and lower separatrices). A minimum strength of the magnetic field remains in a range of 38-200 Gauss adjacent to the walls in the transfer region. In this context, adjacent refers to approximately ⅞ of the radial dimension between the chamber wall and the center of the chamber (other than the central ⅛ that has lower magnetic field strength). At the upper and lower separatrices along the central axis, the magnetic field reduces to zero.

More particularly, in the example in FIG. 6 the magnetic field in the transfer region varies radially as referenced by the letters P, Q and R. The R region has a radial dimension that is approximately ⅛ of the distance between the chamber wall and the central axis and has a magnetic field between 22.5 and 38.7 Gauss. The Q region extends approximately another ¼ of the distance towards the chamber wall and has a magnetic field between 38.7 and 66.6 Gauss. The P region extends the remaining approximately ⅝ of the distance towards the chamber wall and has a magnetic field between 66.6 and 114.5 Gauss. The magnetic field continues to increase to a maximum value (around 1000 Gauss) at the permanent magnets and vanishes to zero on the central axis at the upper and lower separatrices. As can be appreciated, the particular magnetic field values may vary depending upon the specific implementation.

Note that in addition to the absolute field strength a measure of performance for this effect may be the magnitude of $|dB/d\zeta|$, where $\zeta$ is the direction of the ion guiding center trajectory, near the substrate region 30. The merit of magnetic lensing is the use of permanent magnets to create a high curvature field that is not achievable by using the electromagnetic coils alone. Although the term lensing is not strictly correct to describe the ion trajectory, the permanent magnet configuration effectively acts like a lens by collecting the ions from the target region and defocusing them onto the wafer.

As can be appreciated, the present disclosure provides ion confinement in the transfer region while providing significantly improved center to edge uniformity.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A physical vapor deposition (PVD) system, comprising:
a PVD chamber including a target region, a transfer region and a substrate region;
a plurality of electromagnetic coils arranged around the PVD chamber;
first and second annular bands of permanent magnets arranged around the PVD chamber with poles oriented perpendicular to a magnetic field imposed by the electromagnetic coils, wherein:
each of the permanent magnets in the first annular band is arranged with poles having a first polarity closest to a central axis of the PVD chamber;
the first annular band comprises N annular rings of permanent magnets arranged around the central axis in the transfer region between the target region and the second annular band, wherein N is an integer greater than one;
each of the permanent magnets in the second annular band is arranged anti-parallel with respect to the permanent magnets in the first annular band; and
the second annular band comprises M annular rings of permanent magnets arranged around the central axis in the transfer region between the substrate region and the first annular band, wherein M is an integer greater than one.

2. The PVD system of claim 1, wherein the first polarity is South.

3. The PVD system of claim 1, wherein a first fill rate of the N annular rings is approximately one-half.

4. The PVD system of claim 1, wherein a gap that is greater than a width of the permanent magnets is provided between at least two of the N annular rings.

5. The PVD system of claim 1, wherein a minimum strength of the magnetic fields adjacent to walls of the PVD chamber in the transfer region ranges from 38 to 200 Gauss.

6. The PVD system of claim 1, wherein:
the PVD system is a hollow cathode magnetron system; and
a target of the PVD system is non-planar.

7. The PVD system of claim 6, further comprising:
a pedestal that is arranged in the substrate region and that supports a substrate; and
an RF bias generator that biases the pedestal with an RF bias at a frequency greater than or equal to 400 kHz and a power level greater than or equal to 100 Watts.

8. The PVD system of claim 7, wherein plasma is ionized in the substrate region above the substrate.

9. A physical vapor deposition (PVD) system, comprising:
a chamber;
a plurality of electromagnetic coils arranged around the chamber;
first and second annular bands of permanent magnets arranged around the chamber with poles oriented perpendicular to a magnetic field imposed by the electromagnetic coils, wherein:
each of the permanent magnets in the first annular band is arranged with poles having a first polarity closest to a central axis of the chamber;
each of the permanent magnets in the second annular band is arranged anti-parallel with respect to the permanent magnets in the first annular band;
the first annular band comprises N annular rings of permanent magnets arranged around the central axis in a transfer region between a target region and the second annular band; and
the permanent magnets in at least one of the N annular rings are rotationally offset relative to the permanent magnets in at least another one of the N annular rings, where N is an integer greater than one.

10. The PVD system of claim 9, wherein the second annular band comprises M annular rings of permanent magnets arranged around the central axis in the transfer region between a substrate region and the first annular band, where M is an integer greater than zero.

11. A physical vapor deposition (PVD) system, comprising:
a PVD chamber including a target region, a transfer region and a substrate region;
a plurality of electromagnetic coils arranged around the PVD chamber;
first and second annular bands of permanent magnets arranged around the PVD chamber with poles oriented perpendicular to a magnetic field imposed by the electromagnetic coils, wherein:
each of the permanent magnets in the first annular band is arranged with poles having a first polarity closest to a central axis of the PVD chamber;
each of the permanent magnets in the second annular band is arranged anti-parallel with respect to the permanent magnets in the first annular band;
the magnetic fields generated in the PVD chamber produce a first separatrix adjacent to the target region and a second separatrix adjacent to the substrate region; and
the first separatrix is convex and the second separatrix is concave relative to a direction of ion and electron motion while traveling from the target region to the substrate region.

12. A method for at least one of etching a substrate and depositing a target material on the substrate, comprising:
generating magnetic fields in a physical vapor deposition (PVD) chamber using a plurality of electromagnetic coils, wherein the PVD chamber includes a target region, a transfer region and a substrate region;
controlling confinement and beam spreading of target atoms sputtered from a target material using first and second annular bands of permanent magnets,
wherein the first and second annular bands of permanent magnets are arranged around the PVD chamber with poles oriented perpendicular to a magnetic field imposed by the electromagnetic coils,
wherein each of the permanent magnets in the first annular band is arranged with poles having a first polarity closest to a central axis of the PVD chamber;
wherein the first annular band comprises N annular rings of permanent magnets arranged around the central axis in the transfer region between the target region and the second annular band, where N is an integer greater than one;

wherein each of the permanent magnets in the second annular band is arranged anti-parallel with respect to the permanent magnets in the first annular band; and wherein the second annular band comprises M annular rings of permanent magnets arranged around the central axis in a transfer region between the substrate region and the first annular band, where M is an integer greater than one.

13. The method of claim 12, wherein the first polarity is South.

14. The method of claim 12, wherein a first fill rate of the N annular rings is approximately one-half.

15. The method of claim 12, further comprising arranging a gap that is greater than a width of the permanent magnets between at least two of the N annular rings, where N is an integer greater than one.

16. The method of claim 12, wherein a minimum strength of the magnetic fields adjacent to walls of the PVD chamber in the transfer region ranges from 38 to 200 Gauss.

17. The method of claim 12, wherein:
the PVD chamber includes hollow cathode magnetron system; and
a target of the PVD chamber is non-planar.

18. The method of claim 17, further comprising:
supporting a substrate on a pedestal in a substrate region; and
biasing the pedestal with an RF bias at a frequency greater than or equal to 400 kHz and a power level greater than or equal to 100 Watts.

19. The method of claim 18, wherein plasma is ionized in the substrate region above the substrate.

20. A method for at least one of etching a substrate and depositing a target material on the substrate, comprising:
generating magnetic fields in a chamber using a plurality of electromagnetic coils;
controlling confinement and beam spreading of target atoms sputtered from a target material using first and second annular bands of permanent magnets,
wherein the first and second annular bands of permanent magnets are arranged around the chamber with poles oriented perpendicular to a magnetic field imposed by the electromagnetic coils,
wherein each of the permanent magnets in the first annular band is arranged with poles having a first polarity closest to a central axis of the chamber;
wherein the first annular band comprises N annular rings of permanent magnets arranged around the central axis in a transfer region between a target region and the second annular band, where N is an integer greater than one;
wherein each of the permanent magnets in the second annular band is arranged anti-parallel with respect to the permanent magnets in the first annular band; and
wherein the permanent magnets in at least one of the N annular rings are rotationally offset relative to the permanent magnets in at least another one of the N annular rings, where N is an integer greater than one.

21. The method of claim 20, wherein the second annular band comprises M annular rings of permanent magnets arranged around the central axis in the transfer region between a substrate region and the first annular band, where M is an integer greater than zero.

22. A method for at least one of etching a substrate and depositing a target material on the substrate, comprising:
generating magnetic fields in a physical vapor deposition (PVD) chamber using a plurality of electromagnetic coils, wherein the PVD chamber includes a target region, a transfer region and a substrate region;
controlling confinement and beam spreading of target atoms sputtered from a target material using first and second annular bands of permanent magnets,
wherein the first and second annular bands of permanent magnets are arranged around the PVD chamber with poles oriented perpendicular to a magnetic field imposed by the electromagnetic coils,
wherein each of the permanent magnets in the first annular band is arranged with poles having a first polarity closest to a central axis of the PVD chamber;
wherein each of the permanent magnets in the second annular band is arranged anti-parallel with respect to the permanent magnets in the first annular band;
wherein the magnetic fields generated in the PVD chamber produce a first separatrix adjacent to the target region and a second separatrix adjacent to the substrate region; and
wherein the first separatrix is convex and the second separatrix is concave relative to a direction of ion and electron motion while traveling from the target region to the substrate region.

23. A method for at least one of etching a substrate and depositing a target material on the substrate, comprising:
generating magnetic fields in a physical vapor deposition chamber using a plurality of electromagnetic coils; and
adjusting magnetic fields in a transfer region of the PVD chamber to control confinement and beam spreading of target atoms sputtered from the target material using first and second annular bands of permanent magnets arranged around the transfer region,
wherein the first annular band comprises N annular rings of permanent magnets arranged around the central axis in the transfer region, where N is an integer greater than one;
wherein each of the permanent magnets in the first annular band is arranged between a target region and the second annular band and with South poles closest to a central axis of the PVD chamber,
wherein the second annular band comprises M annular rings of permanent magnets arranged around the central axis in the transfer region, where M is an integer greater than one; and
wherein each of the permanent magnets in the second annular band is arranged between the first annular band and a substrate region and with North poles closest to the central axis of the PVD chamber.

24. The method of claim 23, further comprising:
generating a first separatrix adjacent to the target region and a second separatrix adjacent to a substrate region,
wherein the first separatrix is convex and the second separatrix is concave relative to a direction of ion and electron motion while traveling from a target to the substrate.

25. The method of claim 23, wherein the poles of the permanent magnets in the first and second annular bands are oriented perpendicular to a magnetic field imposed by the electromagnetic coils.

26. The method of claim 23, wherein a first fill rate of the first annular band is approximately one-half.

27. The method of claim 23, wherein the permanent magnets in at least one of the N annular rings are rotationally offset relative to the permanent magnets in at least another one of the N annular rings, where N is an integer greater than one.

28. The method of claim 26, further comprising providing a gap that is greater than a width of the permanent magnets between at least two of the N annular rings, where N is an integer greater than one.

29. The method of claim 23, wherein a minimum strength of the magnetic fields adjacent to walls of the PVD chamber in the transfer region ranges from 38 to 200 Gauss.

30. The method of claim 23, wherein:
the PVD chamber includes hollow cathode magnetron system; and
a target of the PVD chamber is non-planar.

31. The method of claim 30, further comprising:
supporting a substrate on a pedestal in a substrate region; and
biasing the pedestal with an RF bias at a frequency greater than or equal to 400 kHz and a power level greater than or equal to 100 Watts.

32. The method of claim 31, wherein plasma is ionized in the substrate region above the substrate.

* * * * *